(12) United States Patent
Hayashi et al.

(10) Patent No.: US 9,136,837 B2
(45) Date of Patent: Sep. 15, 2015

(54) SWITCHING CIRCUIT AND POWER SUPPLY DEVICE INCLUDING SWITCH CIRCUIT

(75) Inventors: Ryosuke Hayashi, Tokyo (JP); Gentaro Ookura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 195 days.

(21) Appl. No.: 13/597,153

(22) Filed: Aug. 28, 2012

(65) Prior Publication Data

US 2013/0181693 A1 Jul. 18, 2013

(30) Foreign Application Priority Data

Jan. 17, 2012 (JP) ................................ 2012-007047

(51) Int. Cl.
*G05F 3/04* (2006.01)
*H03K 17/687* (2006.01)
*H02H 11/00* (2006.01)
*G05F 1/00* (2006.01)
*H03K 17/082* (2006.01)

(52) U.S. Cl.
CPC ......... *H03K 17/6871* (2013.01); *H02H 11/003* (2013.01); *H03K 17/0822* (2013.01)

(58) Field of Classification Search
USPC ......... 323/234, 237, 273, 274, 275, 282, 284, 323/285, 304, 311, 312, 315, 316, 317
See application file for complete search history.

(56) References Cited

U.S. PATENT DOCUMENTS

| 4,675,561 | A | * | 6/1987 | Bowers | 327/382 |
| 5,220,207 | A | * | 6/1993 | Kovalcik et al. | 327/63 |
| 5,517,379 | A | * | 5/1996 | Williams et al. | 361/84 |
| 5,945,842 | A | * | 8/1999 | Sugawara | 326/66 |
| 5,986,441 | A | * | 11/1999 | Koroncai et al. | 323/277 |
| 6,414,404 | B1 | * | 7/2002 | Allen | 307/130 |

(Continued)

FOREIGN PATENT DOCUMENTS

| JP | H04117133 A | 4/1992 |
| JP | 2001177387 A | 6/2001 |
| JP | 2003347913 A | 12/2003 |
| JP | 2006086507 A | 3/2006 |

(Continued)

OTHER PUBLICATIONS

Japanese Office Action dated Sep. 5, 2014, filed in Japanese counterpart Application No. 2012-007047, 5 pages (with translation).

*Primary Examiner* — Jeffrey Gblende
(74) *Attorney, Agent, or Firm* — Patterson & Sheridan, LLP

(57) ABSTRACT

A switching circuit includes first and second MOS transistors of the same conductive type. The second MOS transistor has a drain connected to a first terminal, a source connected to a load connecting terminal, a gate connected to a gate of the first MOS transistor, and a back gate connected to a source of the first MOS transistor. The switching circuit includes a circuit that controls a current flowing between the source of the first MOS transistor and a resistor connecting terminal so that the potential of the source of the first MOS transistor and the potential of the source of the second MOS transistor are equal. This switching circuit further includes a circuit that outputs a control signal to the gate of the first MOS transistor and the gate of the second MOS transistor and controls the operations of the first MOS transistor and the second MOS transistor.

16 Claims, 5 Drawing Sheets

(56) References Cited

U.S. PATENT DOCUMENTS

| | | | |
|---|---|---|---|
| 7,924,540 B2 | 4/2011 | Tamegai | |
| 8,604,880 B2 * | 12/2013 | Boor | 330/277 |
| 2007/0146953 A1 * | 6/2007 | Ono | 361/100 |
| 2008/0012543 A1 | 1/2008 | Negoro | |
| 2010/0013324 A1 * | 1/2010 | Yamashita et al. | 307/125 |
| 2010/0134086 A1 * | 6/2010 | Theil et al. | 323/312 |

FOREIGN PATENT DOCUMENTS

| | | |
|---|---|---|
| JP | 2008021166 A | 1/2008 |
| JP | 2009100519 A | 5/2009 |
| JP | 2009296367 A | 12/2009 |

\* cited by examiner

SWITCHING CIRCUIT AND POWER SUPPLY DEVICE INCLUDING SWITCH CIRCUIT

CROSS-REFERENCE TO RELATED APPLICATION

This application is based upon and claims the benefit of priority from Japanese Patent Application No. 2012-007047, filed Jan. 17, 2012; the entire contents of which are incorporated herein by reference.

FIELD

Embodiments described herein relate to a switching circuit and a power supply device.

BACKGROUND

In conventional switching circuits, the potential of a back gate of a power MOSFET is set to the potential of a source. For this reason, the back gate and the source of the power MOSFET is short-circuited. In other words, a parasitic diode between the back gate and the source of the power MOSFET is short-circuited. Therefore, if a power supply is reversely connected, a large current can flow to a load via the parasitic diode between the back gate and a drain of the power MOSFET.

DETAILED DESCRIPTION

Embodiments disclosed herein provide a switching circuit, which can suppress a current flowing in an output MOS transistor when a power supply is reversely connected, and a power supply device.

The switching circuit according to an embodiment is provided with first and second MOS transistors of the same conductive type. The second MOS transistor has a drain connected to a first terminal, a source connected to a load connecting terminal, a gate connected to a gate of the first MOS transistor, and aback gate connected to the source. This switching circuit includes a potential control circuit that controls a current flowing between the source of the first MOS transistor and a resistor connecting terminal so that the potential of the source of the first MOS transistor and the potential of the source of the second MOS transistor are equal. This switching circuit further includes a switching control circuit that outputs a control signal to the gate of the first MOS transistor and the gate of the second MOS transistor and turns off the first MOS transistor and the second MOS transistor if the power supply is reversely connected.

Embodiment 1

Figure 1:
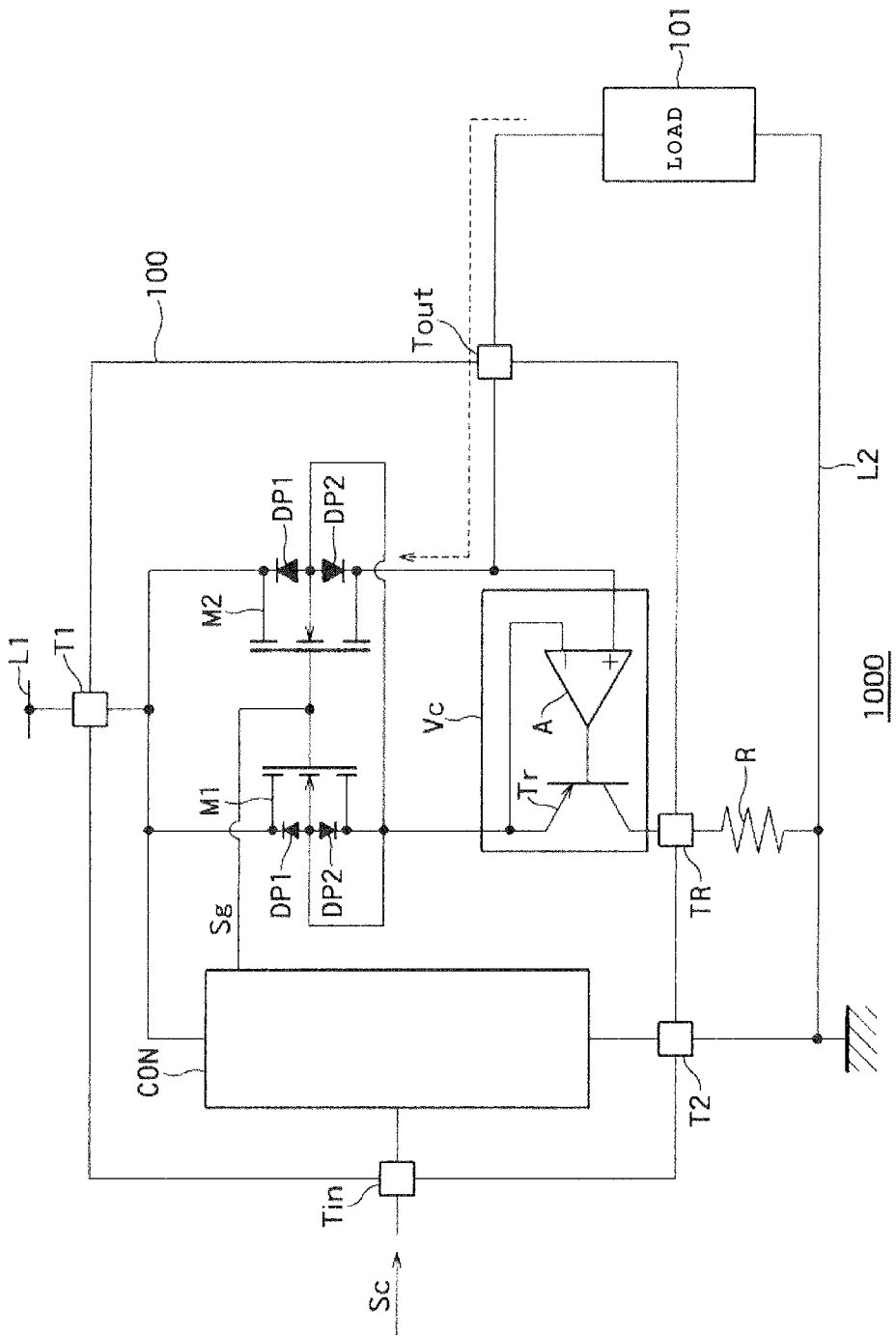
FIG. 1 is a circuit diagram of a power supply device according to a first embodiment.

FIG. 1 is a circuit diagram of a power supply device 1000 according to a first embodiment.

As shown in FIG. 1, the power supply device 1000 is provided with a switching circuit 100 and a resistor R.

The resistor R is connected between a resistor connecting terminal TR and a second potential line L2.

The switching circuit 100 supplies a voltage from a connected power supply to a load 101.

This switching circuit 100, as shown in FIG. 1, is provided with a first terminal (power supply terminal) T1, a second terminal (ground terminal) T2, a load connecting terminal Tout, a resistor connecting terminal TR, a signal input terminal Tin, first MOSFET (nMOS transistor) M1, a second MOS transistor (nMOS transistor) M2 as an output MOS transistor, potential control circuit VC, and a switching control circuit CON.

The first terminal (power supply terminal) T1 is connected to the first potential line L1.

The second terminal (ground terminal) T2 is connected to the second potential line L2.

A load 101 may be connected between the load connecting terminal Tout and the second potential line L2.

The resistor R is connected between the resistor connecting terminal TR and the second potential line L2.

An instruction signal Sc is input to the device at the signal input terminal Tin. Instruction signal Sc may be provided by external circuitry not shown in FIG. 1.

In the first MOS transistor M1, the drain is connected to the first terminal T1, and the source and back gate are electrically connected.

The second MOS transistor M2 is a MOS transistor of the same conductive type as that of the first MOS transistor M1. In the second MOS transistor M2, the drain is connected to the first terminal T1, the source is connected to the load connecting terminal Tout, the gate is connected to the gate of the first MOS transistor M1, and the back gate is connected to the source of the first MOS transistor M1.

Here, the size of the second MOS transistor M2 (i.e., the number of cells in the second MOS transistor M2) is set so that it is greater than the size of the first MOS transistor M1 (i.e., the number of cells in the first MOS transistor M1).

In addition, the potential control circuit VC controls a current flowing between the source of the first MOS transistor M1 and the resistor connecting terminal TR so that the potential of the source of the first MOS transistor M1 and the potential of the source of the second MOS transistor M2 are equal.

This potential control circuit VC, for example, has a bipolar transistor (PNP type bipolar transistor) Tr and an amplifier A as shown in FIG. 1.

The bipolar transistor Tr is connected between the source of the first MOS transistor M1 and the resistor connecting terminal TR.

The amplifier A compares the potential at the source of the first MOS transistor M1 with the potential at the source of the second MOS transistor M2 and outputs a signal to the base of the bipolar transistor Tr. The outputted signal corresponds to the comparison result and serves to control a current flowing in the bipolar transistor Tr.

The instruction signal Sc, which is provided by external circuitry, is inputted into the switching control circuit CON via the signal input terminal Tin.

In addition, the switching control circuit CON is connected between the first terminal T1 and the second terminal T2 to be able to detect the potential of the first terminal T1 and the potential of the second terminal T2.

Moreover, the switching control circuit CON outputs a control signal Sg in response to the instruction signal Sc at the signal input terminal Tin or the detected difference in voltages at the first terminal T1 and the second terminal T2.

In other words, the switching control circuit CON outputs the control signal Sg to the gate of the first MOS transistor M1 and the gate of the second MOS transistor M2, thereby controlling the operations of the first MOS transistor M1 and the second MOS transistor M2.

Here, in case a power supply is normally connected, in this embodiment (also similarly in the following embodiments), it is assumed that the power supply is connected to the first potential line L1 and the ground is connected to the second potential line L2.

On the other hand, in case a power supply is reversely connected, in this embodiment (also similarly in the following embodiments), it is assumed that the ground is connected to the first potential line L1 and the power supply is connected to the second potential line L2. In this case, the potential of the second terminal T2 is higher than the potential of the first terminal T1.

For example, in case the power supply is reversely connected, the switching control circuit CON turns off the first MOS transistor M1 and the second MOS transistor M2 by the control signal Sg.

In other words, if the potential of the second terminal T2 is higher than the potential of the first terminal T1, the switching control circuit CON turns off the first MOS transistor M1 and the second MOS transistor M2 by the control signal Sg.

Figure 2:
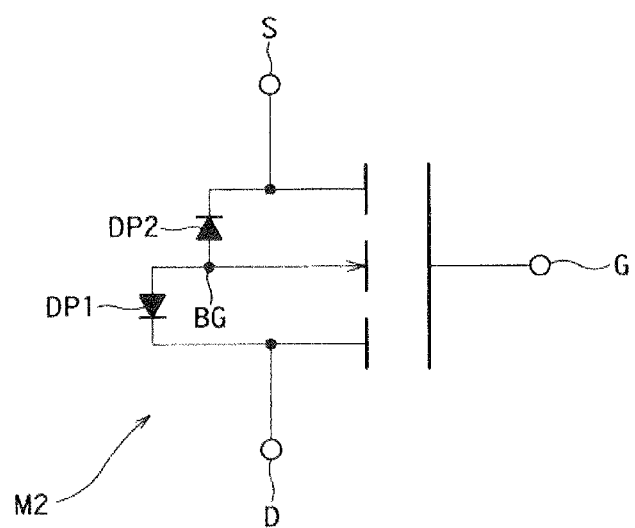
FIG. 2 is a circuit diagram showing a second MOS transistor shown in FIG. 1.

Here, FIG. 2 is a circuit diagram showing the second MOS transistor M2 shown in FIG. 1. In addition, FIG. 3 is a cross-section of the second MOS transistor M2 shown in FIG. 2.

Figure 3:
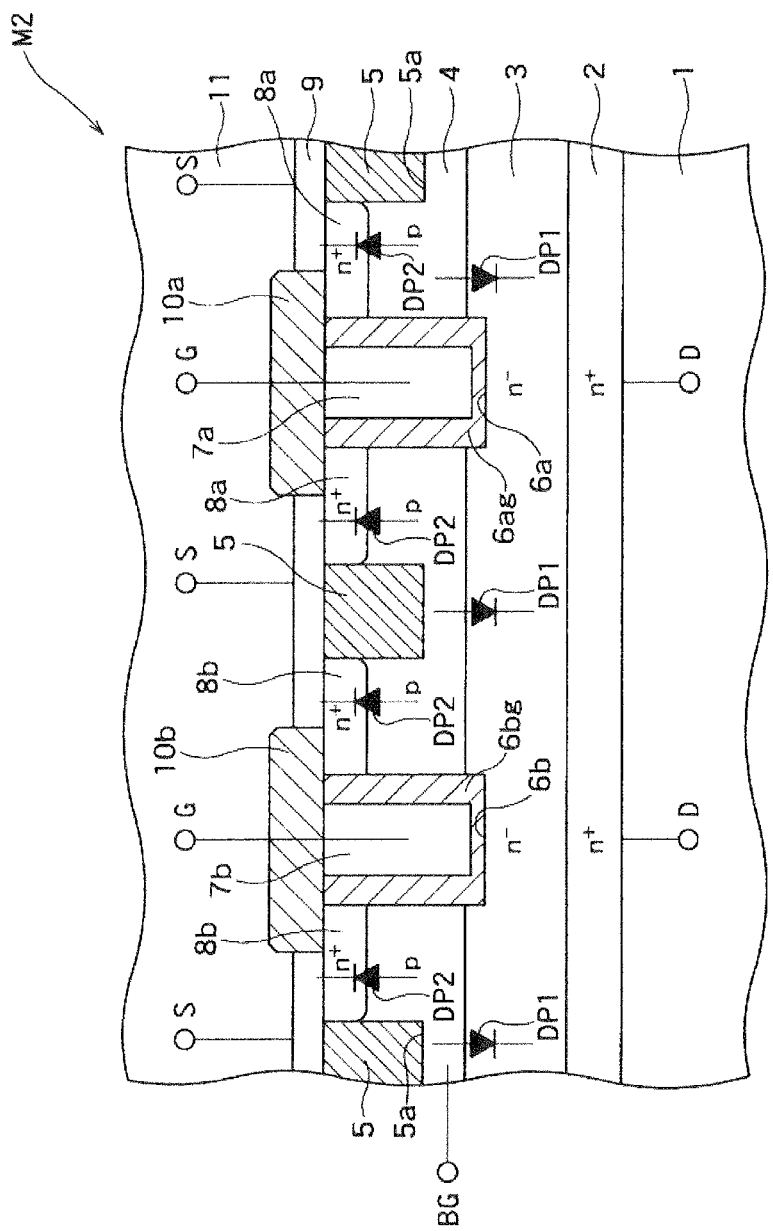
FIG. 3 is a cross-section of the second MOS transistor shown in FIG. 2.

As shown in FIG. 3, the second MOS transistor M2 has semiconductor substrate 1, first conductive type (n+ type) first semiconductor layer 2 with a high impurity concentration, first conductive type (n− type) second semiconductor layer 3 with a low impurity concentration, second conductive type (p type) third semiconductor layer 4, first gate insulating film 6ag, first gate electrode 7a, second gate insulating film 6bg, second gate electrode 7b, first conductive type (n+ type) first diffusion layer 8a with a high impurity concentration, first conductive type (n+ type) second diffusion layer 8b with a high impurity concentration, source electrode 9, second insulating layer 10a, third insulating layer 10b, and interlayer dielectric film 11.

The semiconductor substrate 1, for example, is composed of a semiconductor material such as silicon.

The first semiconductor layer 2 is formed on the semiconductor substrate 1. This first semiconductor layer 2 functions as the drain D (FIG. 2) of the second MOS transistor M2.

The second semiconductor layer 3 is formed on the first semiconductor layer 2.

The third semiconductor layer 4 is formed on the second semiconductor layer 3. This third semiconductor layer 4 functions as the back gate (FIG. 2) of the second MOS transistor M2.

The first gate insulating film 6ag is formed on the inner surface of a first trench 6a which extends from the upper surface of the third semiconductor layer 4 to the upper surface of the second semiconductor layer 3.

The first gate electrode 7a is formed in the first trench 6a which has the first gate insulating film 6ag also formed therein. This first gate electrode 7a functions as the gate of the second MOS transistor M2 (FIG. 2).

The second gate insulating film 6bg is formed on the inner surface of a second trench 6b which extends from the upper surface of the third semiconductor layer 4 to the upper surface of the second semiconductor layer 3.

The second gate electrode 7b is formed in the second trench 6b which has the second gate insulating film 6bg also formed therein. This second gate electrode 7b functions as the gate of the second MOS transistor M2 (FIG. 2).

The first diffusion layer 8a is formed on the upper surface of the third semiconductor layer 4 and laid out so that it and the first gate electrode 7a each make contact with opposing sides of the first gate insulating film 6ag.

The second diffusion layer 8b is formed on the upper surface of the third semiconductor layer 4 and laid out so that it and the second gate electrode 7b each make contact with opposing sides of the second gate insulating film 6bg.

The first insulating layer 5 is formed in a third trench 5a formed on the upper surface of the third semiconductor layer 4 and applies insulation between the first diffusion layer 8a and the second diffusion layer 8b.

The source electrode 9 is formed on the first diffusion layer 8a, first insulating film 5, and second diffusion layer 8b. The source electrode 9 functions as the source of the second MOS transistor M2 (FIG. 2).

The second insulating film 10a covers the aperture (at which the upper surface of the first gate electrode 7a is disposed) of the first trench 6a.

The third insulating film 10b covers the aperture (at which the upper surface of the second gate electrode 7b is disposed) of the second trench 6b.

The interlayer dielectric film 11 is formed on the source electrode 9, second insulating layer 10a, and third insulating layer 10b.

Here, parasitic diodes DP1 (FIG. 2) are formed by the first conductive type second semiconductor layer 3 and the second conductive type third semiconductor layer 4.

In addition, parasitic diodes DP2 (FIG. 2) are formed by the first conductive type first and second diffusion layers 8a and 8b and the second conductive type third semiconductor layer 4.

Here, the operational characteristics of the switching circuit 100 of this embodiment with the above described configuration will be explained.

For example, when a power supply is normally connected, the switching control circuit CON outputs the control signal Sg to the gate of the first MOS transistor M1 and the gate of the second MOS transistor M2 in response to the instruction signal Sc inputted, by external circuitry, at the signal input terminal Tin. In this way, the switching control circuit CON controls the operations of the first MOS transistor M1 and the second MOS transistor M2.

In other words, in a normal operation, the switching circuit 100 can set the potential of the power source, the potential of the sense source, and the potential of the back gate to the same potential, thus being able to realize operations similar to those of a general high side IPD (Intelligent Power Device).

On the other hand, in case the power supply is reversely connected, the switching control circuit CON, as already mentioned above, turns off the first MOS transistor M1 and the second MOS transistor M2 by the control signal Sg.

In other words, if the potential at the second terminal T2 is higher than the potential at the first terminal T1, the switching control circuit CON turns off the first MOS transistor M1 and the second MOS transistor M2 by the control signal Sg.

At that time, when the power supply is reversely connected, the parasitic diode DP2 between the back gate and the source of the second MOS transistor M2 prevents a backward current from flowing to the second MOS transistor M2.

As mentioned above, according to the switching circuit of this embodiment, in case the power supply is reversely connected, a current flow to the output MOS transistor M2 can be suppressed.

Embodiment 2

In this second embodiment, there will be an explanation of an example configuration in which the parasitic diode DP2 for suppressing a backward current from flowing to the second MOS transistor M2 is protected. This protection improves the withstand voltage when a power supply is reversely connected, as will be explained.

Figure 4:
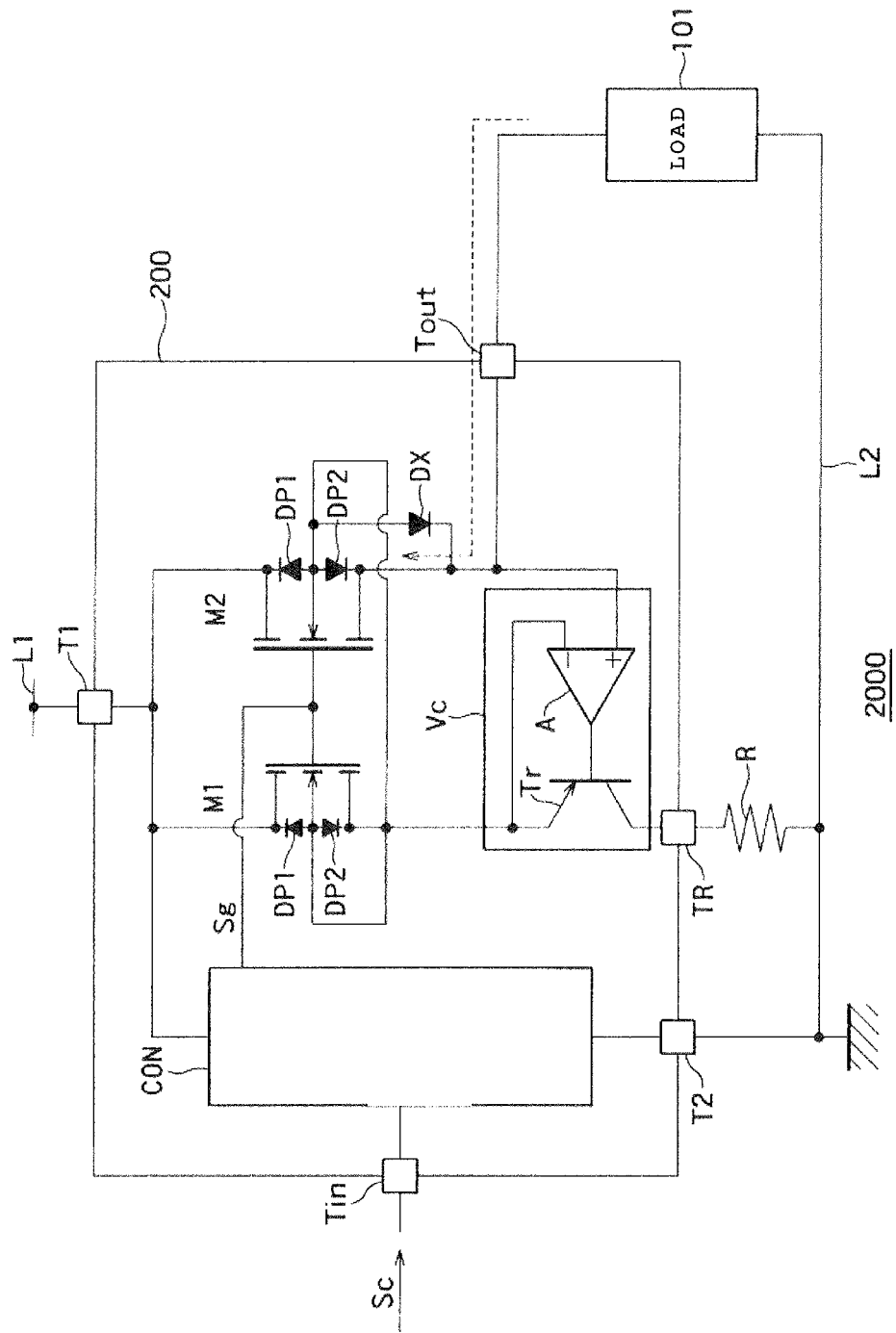
FIG. 4 is a circuit diagram of a power supply device according to a second embodiment.

Here, FIG. 4 is a circuit diagram of a power supply device 2000 according to the second embodiment. In addition, in FIG. 4, the same symbols as the symbols of FIG. 1 are used to show components similar to those of the first embodiment.

As shown in FIG. 4, the power supply device 2000 is provided with a switching circuit 200 and a resistor R similar to corresponding components of power supply device 1000 of the first embodiment.

The switching circuit 200 is further provided with a diode (Zener diode) DX, which is not found in the switching circuit 100 of the first embodiment.

In this diode DX, an anode is connected to the back gate of the second MOS transistor M2, and a cathode is connected to the source of the second MOS transistor M2.

The breakdown voltage of the diode DX is set so that it is lower than the breakdown voltage of the parasitic diode DP2. Therefore, the withstand voltage is improved, thus enabling suppression of the breakdown of the parasitic diode DP2 at a time of reverse connection.

Also, the diode DX may alternatively be externally attached to the outside of the switching circuit 200.

Figure 5:
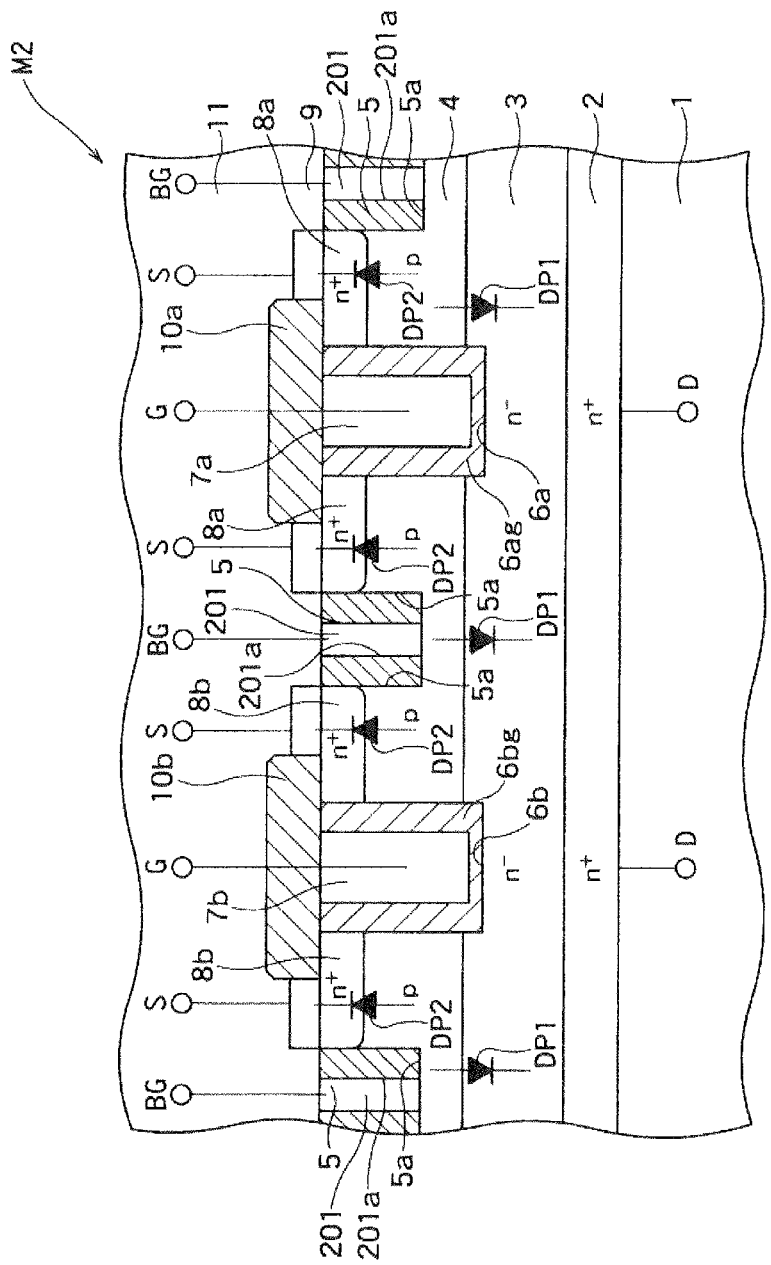
FIG. 5 is a cross-section of a MOS transistor shown in FIG. 4.

FIG. 5 is a cross-section of the second MOS transistor M2 shown in FIG. 4. In addition, in FIG. 5, the same symbols as the symbols of FIG. 3 are used to show components similar to those of the first embodiment.

As shown in FIG. 5, the second MOS transistor M2 has a contact wiring 201, which is not found in the first embodiment.

This contact wiring 201 is formed in a fourth trench 201a extending from the upper surface of the first insulating layer 5 to the upper surface of the third semiconductor layer 4. The lower end of the contact wiring 201 is electrically connected to the third semiconductor layer 4.

In addition, in the diode DX shown in FIG. 4, an anode is electrically connected to the upper surface of the contact wiring 201, and a cathode is electrically connected to the source electrode 9.

With this configuration, the switching circuit 200 improves the withstand voltage by the diode DX, thus being enabling suppression of the breakdown of the parasitic diode DP2 at a time of reverse connection.

Here, other constitutions and functions of the switching circuit 200 are similar to those of the switching circuit 100 of the first embodiment.

In other words, according to the switching circuit of this embodiment, similar to the first embodiment, a current flowing to the output MOS transistor M2 can be suppressed when the power supply is reversely connected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A switching circuit for supplying a voltage from a connected power supply to a load, the switching circuit comprising:
   a first MOS transistor having a gate, a drain connected to a first terminal, and a source and a back gate that are connected to each other;
   a second MOS transistor having a drain connected to the first terminal, a source connected to a second terminal, a gate connected to the gate of the first MOS transistor, and a back gate connected to the source of the first MOS transistor;
   a potential control circuit configured to control a current flowing between the source of the first MOS transistor and a third terminal such that a potential of the source of the first MOS transistor and a potential of the source of the second MOS transistor are equal; and
   a switching control circuit configured to turn off the first MOS transistor and the second MOS transistor by outputting a control signal to the gate of the first MOS transistor and the gate of the second MOS transistor when a potential at a fourth terminal is higher than a potential at the first terminal, wherein
   the second MOS transistor comprises:
   a first semiconductor layer of a first conductive type on a semiconductor substrate and having a first impurity concentration, the first semiconductor layer being the drain;
   a second semiconductor layer of the first conductive type on the first semiconductor layer and having a second impurity concentration lower than the first impurity concentration;
   a third semiconductor layer of a second conductive type on the second semiconductor layer and being the back gate;
   a first gate electrode adjacent to the second semiconductor layer and the third semiconductor layer via a first gate insulating film;
   a second gate electrode adjacent to the second semiconductor layer and the third semiconductor layer via a second gate insulating film;
   a first diffusion layer of the first conductive type on an upper surface of the third semiconductor layer and adjacent to the first gate electrode via the first gate insulating film;
   a second diffusion layer of the first conductive type on the upper surface of the third semiconductor layer and adjacent to the second gate electrode via the second gate insulating film;
   a first insulating film between the first diffusion layer and the second diffusion layer; and
   a source electrode on the first diffusion layer and the second diffusion layer.

2. The switching circuit according to claim 1, further comprising a diode having an anode connected to the back gate of the second MOS transistor, and a cathode connected to the source of the second MOS transistor.

3. The switching circuit according to claim 1, wherein the first MOS transistor and the second MOS transistor are nMOS transistors.

4. The switching circuit according to claim 1, wherein the potential control circuit comprises:
   a bipolar transistor connected between the source of the first MOS transistor and the third terminal; and an amplifier that compares a potential of the source of the first MOS transistor with a potential of the source of the second MOS transistor and outputs a signal to a base of the bipolar transistor according to the comparison result to control a current flowing in the bipolar transistor.

5. The switching circuit according to claim 1, wherein the second MOS transistor further comprises:
a contact wiring that extends from an upper surface of the first insulating layer to the upper surface of the third semiconductor layer, wherein a lower surface of contact wiring is connected to the third semiconductor layer.

6. The switching circuit according to claim 5, further comprising:
a diode in which an anode is electrically connected to an upper surface of the contact wiring and a cathode is electrically connected to the source electrode.

7. A device for supplying power to a load, comprising:
a power supply; and
a switching circuit having a first terminal connected to a first potential line of the power supply, a second terminal connected to the load, and a third terminal connected to a resistor that is connected between the third terminal and a second potential line of the power supply, wherein the switching circuit comprises:
a first MOS transistor having a gate, a drain connected to the first terminal, and a source and a back gate that are connected to each other,
a second MOS transistor having a drain connected to the first terminal, a source connected to the second terminal, a gate connected to the gate of the first MOS transistor, and a back gate connected to the source of the first MOS transistor,
a potential control circuit that controls a current flowing between the source of the first MOS transistor and the third terminal so that a potential of the source of the first MOS transistor and a potential of the source of the second MOS transistor are equal; and
a switching control circuit that outputs a control signal to the gate of the first MOS transistor and the gate of the second MOS transistor and turns off the first MOS transistor and the second MOS transistor when a potential of the first potential line is lower than a potential of the second potential line, wherein
the second MOS transistor comprises:
a first semiconductor layer of a first conductive type on a semiconductor substrate and having a first impurity concentration, the first semiconductor layer being the drain;
a second semiconductor layer of the first conductive type on the first semiconductor layer and having a second impurity concentration lower than the first impurity concentration;
a third semiconductor layer of a second conductive type on the second semiconductor layer and being the back gate;
a first gate electrode adjacent to the second semiconductor layer and the third semiconductor layer via a first gate insulating film;
a second gate electrode adjacent to the second semiconductor layer and the third semiconductor layer via a second gate insulating film;
a first diffusion layer of the first conductive type on an upper surface of the third semiconductor layer and adjacent to the first gate electrode via the first gate insulating film;
a second diffusion layer of the first conductive type on the upper surface of the third semiconductor layer and adjacent to the second gate electrode via the second gate insulating film;

a first insulating film between the first diffusion layer and the second diffusion layer; and
a source electrode on the first diffusion layer and the second diffusion layer.

8. The device of claim 7, wherein the first MOS transistor and the second MOS transistor are of the same conductive type.

9. The device of claim 8, wherein the second MOS transistor is larger in size than the first MOS transistor.

10. The device of claim 7, further comprising a diode having an anode connected to the back gate of the second MOS transistor, and a cathode connected to the source of the second MOS transistor.

11. A switching circuit for supplying a voltage from a power supply to a load, the switching circuit comprising:
a first MOS transistor having a gate, a drain connected to a first terminal, and a source and a back gate that are connected to each other;
a second MOS transistor having a drain connected to the first terminal, a source connected to a second terminal, a gate connected to the gate of the first MOS transistor, and a back gate connected to the source of the first MOS transistor;
a potential control circuit that controls a current flowing between the source of the first MOS transistor and a third terminal, so that a potential of the source of the first MOS transistor and a potential of the source of the second MOS transistor are equal; and
a switching control circuit configured to output a control signal to the gate of the first MOS transistor and the gate of the second MOS transistor to turn off the first MOS transistor and the second MOS transistor in response to an instruction signal received at a signal input terminal connected to the switching control circuit and when the power supply is connected to the load in a reverse manner, wherein
the second MOS transistor comprises:
a first semiconductor layer of a first conductive type on a semiconductor substrate and having a first impurity concentration, the first semiconductor layer being the drain:
a second semiconductor layer of the first conductive type on the first semiconductor layer and having a second impurity concentration lower than the first impurity concentration;
a third semiconductor layer of a second conductive type on the second semiconductor layer and being the back gate;
a first gate electrode adjacent to the second semiconductor layer and the third semiconductor layer via a first gate insulating film;
a second gate electrode adjacent to the second semiconductor layer and the third semiconductor layer via a second gate insulating film;
a first diffusion layer of the first conductive type on an upper surface of the third semiconductor layer and adjacent to the first gate electrode via the first gate insulating film;
a second diffusion layer of the first conductive type on the upper surface of the third semiconductor layer and adjacent to the second gate electrode via the second gate insulating film;
a first insulating film between the first diffusion layer and the second diffusion layer; and
a source electrode on the first diffusion layer and the second diffusion layer.

12. The switching circuit according to claim 11, wherein the instruction signal is input from the outside.

13. The switching circuit according to claim 11, wherein the switching control circuit detects the power supply is connected in the reverse manner based on a difference in potentials at the first and second terminals.

14. The switching circuit according to claim 11, further comprising:
   a diode in which an anode is electrically connected to an upper surface of a contact wiring and a cathode is electrically connected to the source electrode.

15. The switching circuit according to claim 11, wherein the second MOS transistor further comprises:
   a contact wiring that extends from an upper surface of the first insulating layer to the upper surface of the third semiconductor layer, wherein a lower surface of contact wiring is connected to the third semiconductor layer.

16. The switching circuit according to claim 15, further comprising:
   a diode in which an anode is electrically connected to an upper surface of the contact wiring and a cathode is electrically connected to the source electrode.

* * * * *